United States Patent
Lazar et al.

(10) Patent No.: US 7,663,368 B2
(45) Date of Patent: Feb. 16, 2010

(54) ARRANGEMENT FOR RADIATION OF A RADIO-FREQUENCY FIELD

(75) Inventors: Razvan Lazar, Erlangen (DE); Wolfgang Renz, Erlangen (DE); Thorsten Speckner, Marloftstein (DE)

(73) Assignee: Siemens Aktiengesellschaft, Munich (DE)

( * ) Notice: Subject to any disclaimer, the term of this patent is extended or adjusted under 35 U.S.C. 154(b) by 193 days.

(21) Appl. No.: 12/018,333

(22) Filed: Jan. 23, 2008

(65) Prior Publication Data

US 2008/0180102 A1 Jul. 31, 2008

(30) Foreign Application Priority Data

Jan. 31, 2007 (DE) .................. 10 2007 004 812

(51) Int. Cl.
*G01V 3/00* (2006.01)
(52) U.S. Cl. ........................ 324/318; 600/421

(58) Field of Classification Search ......... 324/300–322; 600/407–445; 335/301, 216, 299; 343/787, 343/703, 788, 872
See application file for complete search history.

(56) References Cited

U.S. PATENT DOCUMENTS

| 6,023,167 | A  | * | 2/2000 | DeMeester et al. | .......... 324/318 |
| 6,252,403 | B1 | * | 6/2001 | Alsop | .......... 324/318 |
| 6,294,972 | B1 |   | 9/2001 | Jesmanowicz et al. | |
| 6,850,206 | B2 |   | 2/2005 | Heid et al. | |
| 7,002,347 | B2 |   | 2/2006 | Feiweier et al. | |
| 7,199,585 | B2 | * | 4/2007 | Kruiskamp et al. | .......... 324/320 |
| 2007/0010702 | A1 | * | 1/2007 | Wang et al. | .......... 600/8 |

* cited by examiner

*Primary Examiner*—Brij B Shrivastav
(74) *Attorney, Agent, or Firm*—Schiff Hardin LLP

(57) ABSTRACT

An arrangement for radiation of a radio-frequency field into an examination subject has a local coil unit with a housing. An insulating dielectric material is embodied at least at one part of the housing in order to passively compensate an inhomogeneity of the B1 field that occurs in the examination subject. An adjustment arrangement allows for fixed but detachable provision of the insulating dielectric material at the housing part.

14 Claims, 7 Drawing Sheets

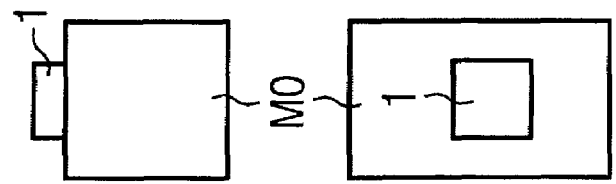
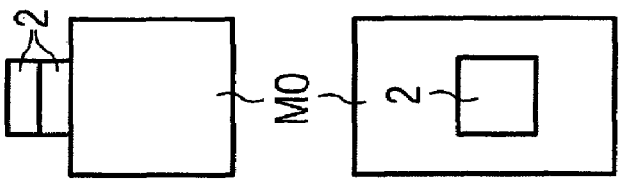
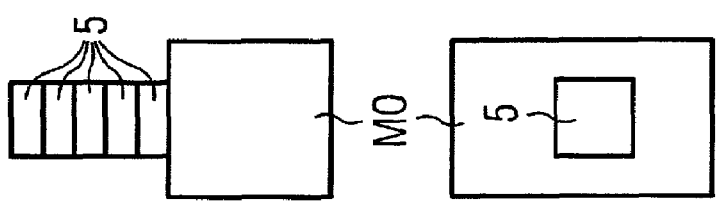
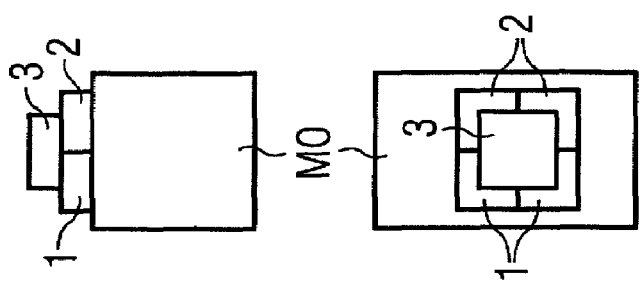
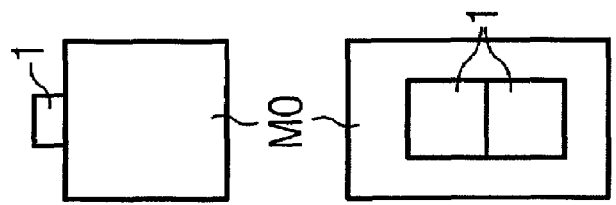

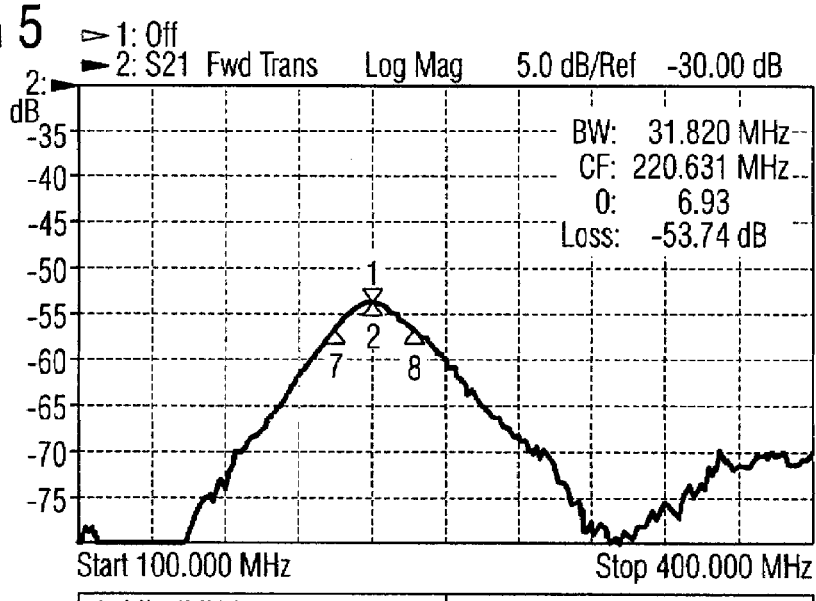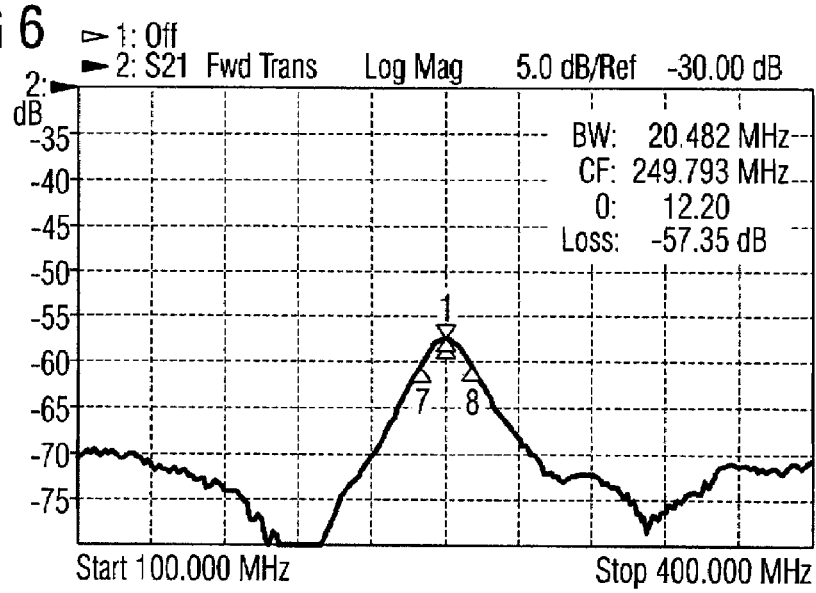

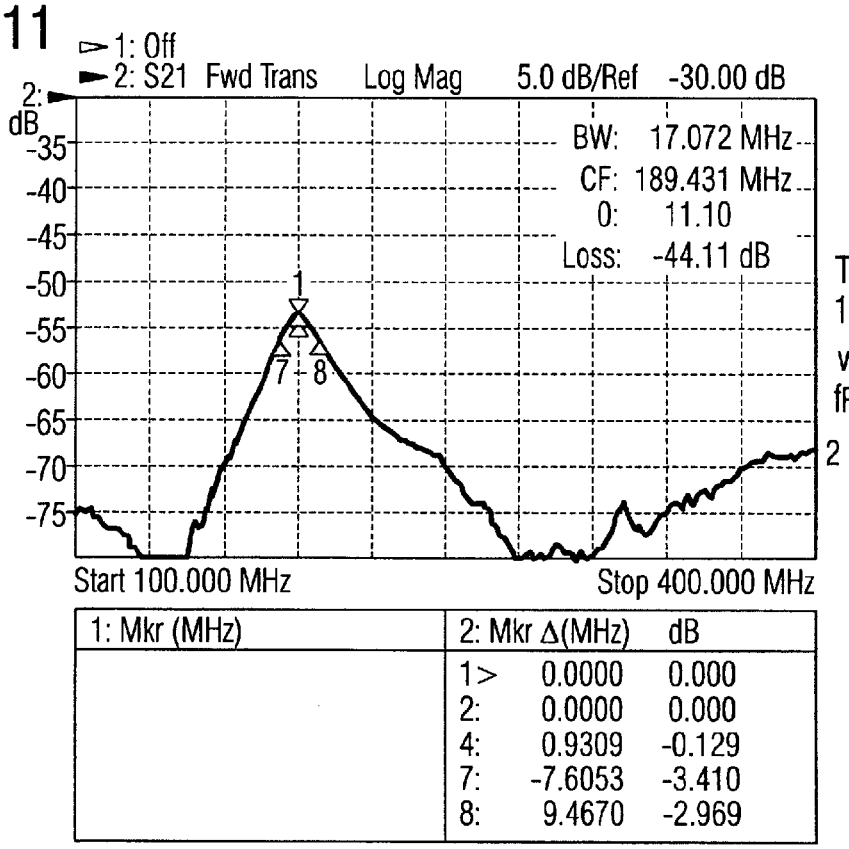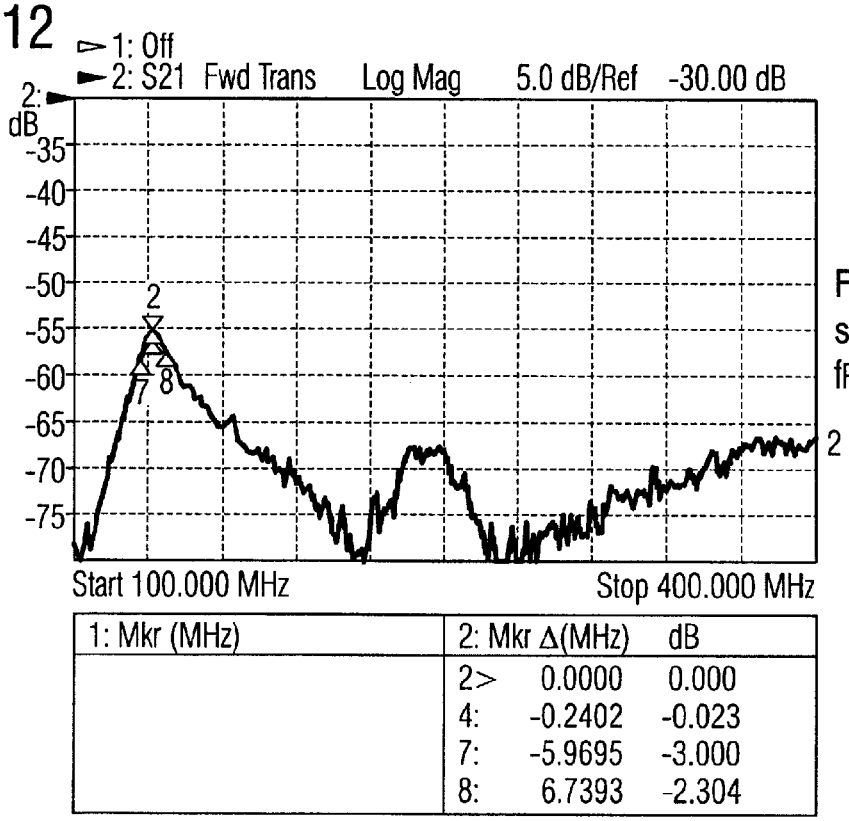

ARRANGEMENT FOR RADIATION OF A RADIO-FREQUENCY FIELD

BACKGROUND OF THE INVENTION

1. Field of the Invention

The invention concerns an arrangement for radiation of a radio-frequency field into an examination subject in a magnetic resonance apparatus.

2. Description of the Prior Art

In magnetic resonance tomography, an examination subject is exposed to an optimally homogeneous, static basic magnetic field. This basic magnetic field is generated by a basic field magnet of the magnetic resonance apparatus.

Rapidly switched gradient fields for spatial coding of the magnetic resonance signals are superimposed on the basic magnetic field during the acquisition of the magnetic resonance images. The gradient fields are generated by gradient coils.

Radio-frequency pulses of a defined field strength are radiated into the examination subject with radio-frequency antennas. The magnetic flux density of these radio-frequency pulses is typically designated with B1; the pulse-shaped radio-frequency field is called the B1 field. Magnetic resonance signals that are acquired by radio-frequency acquisition antennas are triggered in the examination subject by the radio-frequency pulses.

Temporal and spatial fluctuations in the field strength of the exciting B1 field can lead to adulterated measurement results. These unwanted fluctuations in particular disruptively occur at magnetic flux densities of more than 1.5 Tesla.

To acquire magnetic resonance signals, radio-frequency acquisition antennas are used that are either permanently installed in the magnetic resonance apparatus or are fashioned to be movable, the latter being known as "local coil units". These local coil units are specifically positioned close to the examination region and allow improved measurement results.

An arrangement in which the housing of a local coil unit for a magnetic resonance apparatus is fashioned such that at least one part of the housing embodies an insulating dielectric material is known from DE 103 45 176 A1. Inhomogeneities of the B1 field are thereby compensated in a passive manner in order to improve measurements on the examination subject.

SUMMARY OF THE INVENTION

An object of the present invention is to provide an arrangement of the aforementioned type with which the passive compensation of inhomogeneities of the B1 field is further improved.

The inventive arrangement for radiation of a radio-frequency field into an examination subject has a local coil unit with a housing. An insulating, dielectric material is embodied at least atone part of the housing in order to passively compensate an inhomogeneity of a B1 field occurring in the examination subject. An adjustment arrangement allows for fixed but detachable provision of the insulating dielectric material arranged at the housing part.

A variation of the arrangement of the insulating dielectric material or a variation of the electrical characteristic values of the material in order to allow a flexibly adjustable compensation is thereby enabled. In other words: the insulating dielectric material is arranged at the housing part such that it can be exchanged.

With the inventive arrangement it is possible to flexibly adjust the compensation by iteration.

An optimal compensation (for example by the operating personnel) can be effected in order to optimally show individual, selected (sub-) regions or in order to acquire an optimized representation of a larger examination region, depending on the requirement of the measurement result.

For example, through adaptive variation of the insulating dielectric material, a selected sub-region of a larger examination region can be depicted very sharp and/or light in an image representation while the remaining examination region is correspondingly disregarded in the image reproduction.

In other words, a user-specific focusing in the image representation is also enabled during the examination by the material variation and the compensation of the B1 field that is associated therewith.

The insulating dielectric material is adapted in terms of its volume and/or in terms of its permittivity or (dielectric conductivity) to the respective subject to be examined. This adaptation particularly advantageously ensues dependent on the conditions during the examination.

Given simultaneous use of a number of these materials that can differ in size, volume and their electrical values are achieved by the combination resulting values. A very finely-stepped adaptation is therewith possible.

For variation of the volume it is possible to fashion the material plate-shaped in order to stack the material this as part of the housing or in the housing.

For variation of the thickness of the plates and/or their area, respectively suitable volumes are set.

Given a stacking of plates it is possible to additionally influence the resulting dielectric conductivity by making use of a pre-established air gap between the plates.

In an embodiment, the material exhibits a relative permittivity $\in_r$ of greater than 50, preferably greater than 100.

In another embodiment, the material exhibits a dielectric loss factor of tan $\delta$ smaller than $2.5\times10^{-2}$, preferably of less than $1\times10^{-3}$.

In a further embodiment of the local coil unit, the material is fashioned as an optimally closed area which is preferably 100 cm$^2$ to 500 cm$^2$ in size. This area approximately corresponds to the dimensions of the eddy currents that lead to B1 field attenuation.

BRIEF DESCRIPTION OF THE DRAWINGS

FIGS. 4A through 4E illustrate different variations of the dielectric conductivity and/or of the volume of the material.

FIG. 5 through FIG. 7 are graphs respectively showing dielectric resonances of individual plates.

FIG. 10 through FIG. 12 are graphs respectively showing dielectric resonances of stacked plates without air gap, thus with strong coupling.

DESCRIPTION OF THE PREFERRED EMBODIMENTS

Figure 1:
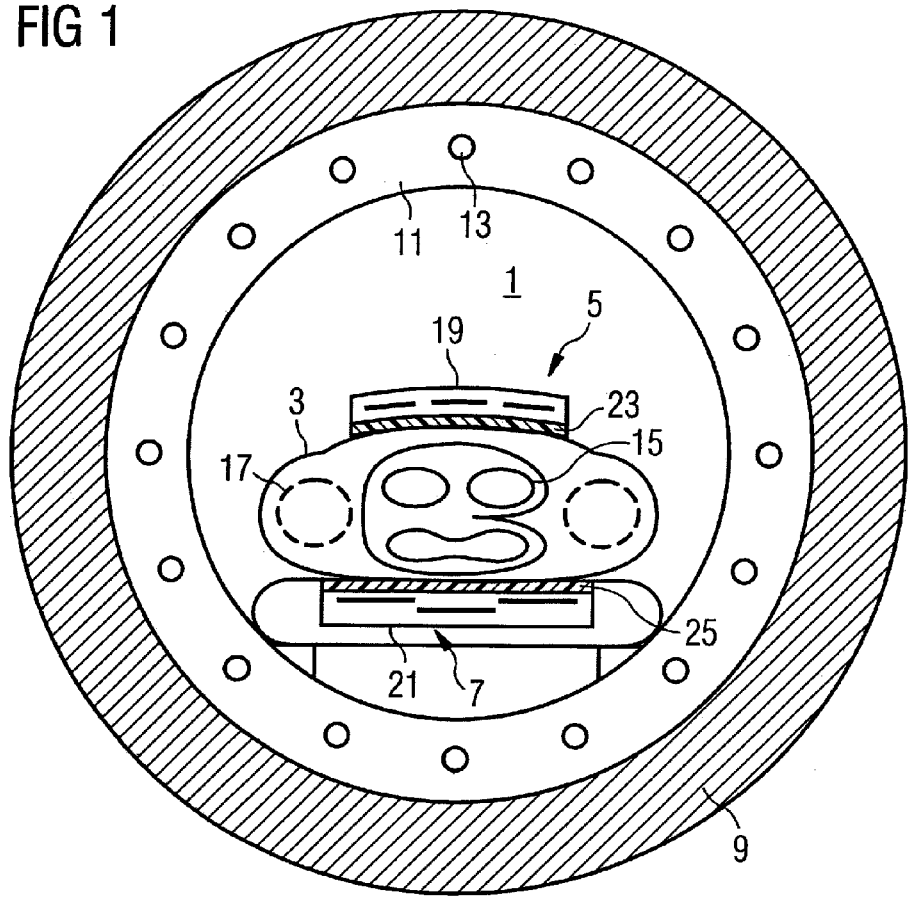
FIG. 1 shows a cross-section through an examination region of a magnetic resonance apparatus.

FIG. 1 shows a cross-section through an examination region 1 of a magnetic resonance apparatus in which a patient 3 is examined with a body coil unit 5 and a spinal column coil unit 7.

In the examination region 1 the basic magnetic field is generated with the aid of the basic field magnet 9. A radio-frequency field generated with a whole-body antenna 11 is superimposed on this basic magnetic field. With the whole-body coil 11 it is sought to generate an optimally homogeneous B1 field within the body of the patient 3. Remaining inhomogeneities of the B1 field are schematically drawn in the body of the patient 3. The solid lines 15 correspond to fields with reduced B1 field strength; the dashed lines 17 delineate schematic regions with increased B1 field strength. The inhomogeneities are essentially generated in the patient 3 by inductively generated eddy currents. These flow in the heart region as well as in the region of the back musculature.

Magnetic resonance signals of the trunk of the patient 3 are acquired with local coil units, for example the body coil unit 5 and the spinal column coil unit 7. These units have multiple coils that are arranged in a housing 19, 21.

An insulating dielectric material 23, 25 is arranged on a portion of the housing. It is preferably arranged in the regions of the coil unit 5, 7 that are in contact with the patient 3.

Depending on the embodiment the insulating dielectric material 23, 25 can form a portion of the housing, i.e. be integrated into a housing wall, or can be arranged in the housing itself, or can be externally attached on the housing.

The insulating dielectric material is advantageously fashioned as a closed area and advantageously exhibits a thickness of a few millimeters up to a few centimeters.

The insulating dielectric material advantageously has a specific resistance of greater than $10^8 \Omega$ and a relative dielectric constant (relative permittivity) $\in_r$ of at least 50, advantageously of greater than 100.

Furthermore, the material advantageously also has a small dielectric loss factor tan $\delta$ of at maximum $2.5 \times 10^{-2}$, preferably at maximum $1 \times 10^{-3}$.

Materials that satisfy the specified conditions for the relative dielectric constant $\in_r$ and the dielectric loss factor tan $\delta$ are in particular ceramic dielectrics as they are used, for example, for RF capacitors.

Suitable dielectrics are listed in the German standard for ceramics and glass insulation substances "DIN VDE 0335", part 1 and part 3, February 1988, and in the corresponding international standard "IEC 672-1 and 672-3" under the group designation "C-300".

Some suitable ceramic masses made from titanates with perovskite-like crystal structure are also to be learned from the book "HÜTTE des Ingenieurstaschenbuchs", 28th edition, volume Hütte IV A: Electrical engineering, part A, 1957, pages 802, 803. Particularly suitable materials are oxide-ceramic materials, for example pyro- or piezo-oxides such as, for example, $TiO_2$, $BaTiO_3$, $(BaSr)TiO_3$, $PbTiO_3PbXrO_3$ or $Pb(Zr,Ti(O_3))$.

In an embodiment of the spinal column coil unit 7, the material is arranged shaped like plates in the cover of the housing (which is fashioned flat and box-shaped) of the spinal column coil unit 7.

Figure 2:
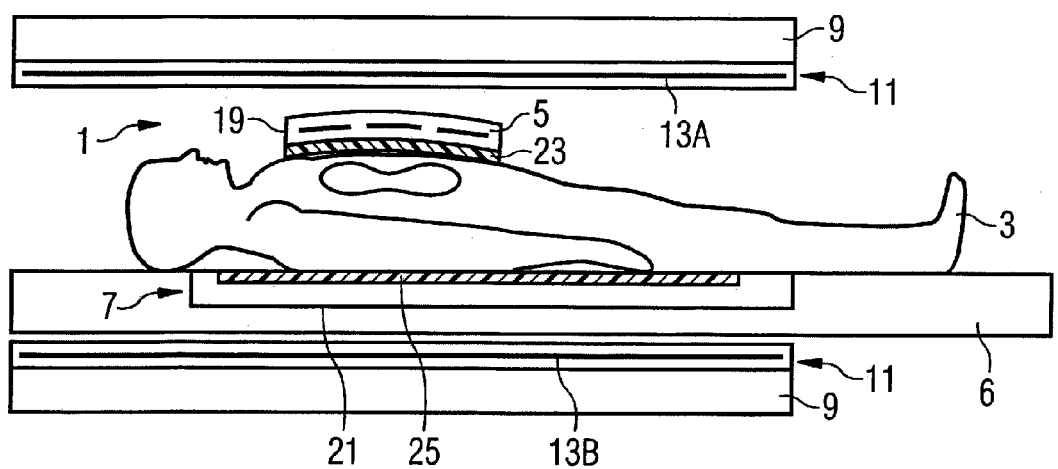
FIG. 2 shows a longitudinal section through the examination region.

FIG. 2 shows a longitudinal section through the examination region 1 into which the patient 3 on the patient bed 6 has been moved for examination of his torso. The body coil 5 covers the chest of the patient 3 that, lying on his back on the spinal column coil unit 7, lies in the region of his spinal column. The material 23, 25 is arranged plate-shaped in the coil units near the B1 field minima in the patient and is in contact with the patient over an optimally large surface.

For example, the embodiments presented in FIG. 3A through FIG. 3F are possible for adjustment of the compensation via the insulating dielectric material at the housing or at the housing part.

Figure 3A:
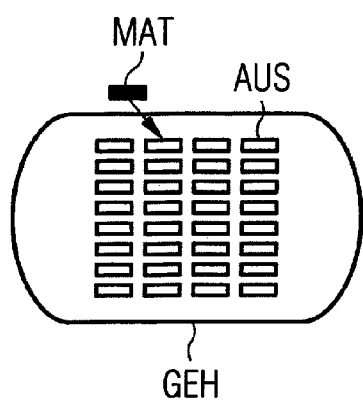
FIGS. 3A through 3F respectively illustrate embodiments for variation of the compensation.

In a first embodiment according to FIG. 3A, recesses AUS for pre-assembled material shapes are provided at the housing GEH in order to adjust the total effect of the material MAT specific to the customer. The material MAT can be fashioned in the form of a pin or, a bar, for example.

The housing GEH itself is advantageously produced from an electrically neutral to weakly "dielectrically conductive" material.

The recesses AUS for material acceptance are, for example, distributed on the housing GEH like a checkerboard so that the user can occupy the recesses AUS at arbitrary points with the insulating dielectric material MAT.

If the occupation of the recesses ensues at an outer housing side, means for locking or for securing the material in the recess are provided (not shown here). A demounting of the local coil is therewith advantageously prevented; the occupation ensues from the outside without having to open the housing GEH.

Figure 3B:
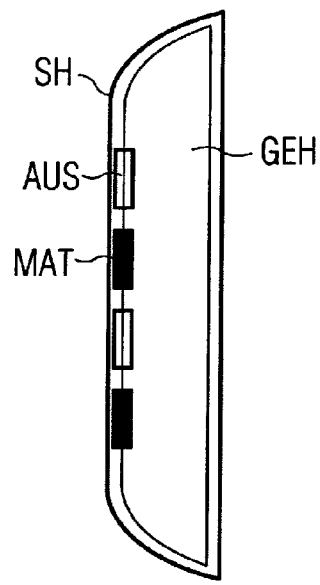

In a second embodiment according to FIG. 3B the housing GEH and the respectively arranged material MAT are surrounded by a protective casing SH. This protective casing SH is closely conformed to the housing GEH in order to avoid a sliding of the material MAT used for compensation out from the associated positions.

This variant offers a maximum flexibility and allows an "application-specific" compensation given recurring examinations.

The user designs the properties and/or the distribution of the compensation material, adapted to the specific application. The optimization of the homogeneity of the B1 field is implemented iteratively and interactively.

Figure 3C:
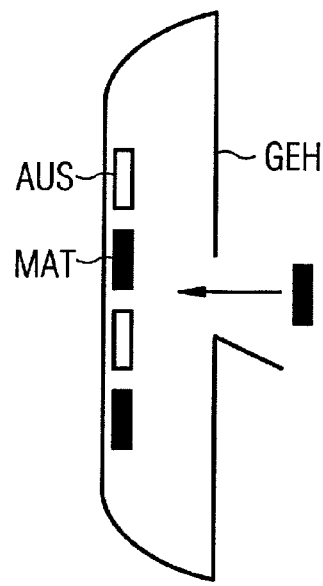

In a third embodiment according to FIG. 3C, the housing GEH is designed for opening. An adaptation of the compensation material MAT inside the housing GEH is implemented at the factory or by an authorized laboratory. The pre-occupation again ensues according to customer-specific specifications.

Figure 3D:
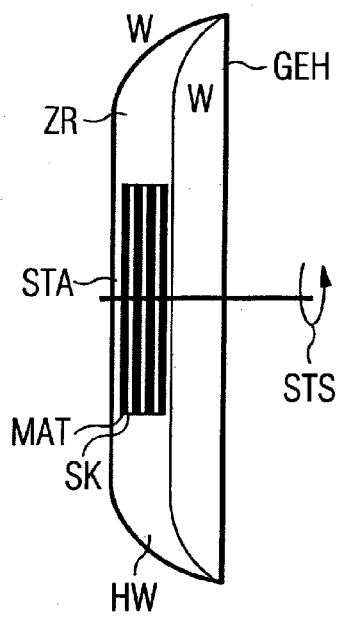

In a fourth embodiment according to FIG. 3D the housing has a hollow wall (cladding) HW, i.e. two walls W enclosing an intervening space [interstice] ZR and thus exhibiting a separation from one another. The dielectric material MAT is fashioned plate-shaped within the hollow wall HW and is arranged in the shape of a stack STA. The individual dielectric plates are separated from one another by elastic foamed material cushions SK.

The separation between the individual material plates MAT, which separation is set by the foamed material cushions SK, is varied with an adjusting screw STS. If the adjusting screw STS is tightened, the separation between the dielectric plates MAT reduces due to the compression of the foamed material SK. These plates MAT thus couple more strongly; the total effect or the resulting dielectric conductivity of the stack STA thus increases. The wall of the housing GEH is advantageously supported such that it can move at the position of the adjusting screw.

This embodiment with adjusting screw STS is designated as a "sagittal compression screw".

In a fifth embodiment according to FIG. 3E, the housing GEH again comprises a hollow wall HW. The dielectric material is fashioned shaped like a plate, whereby the individual plates are arranged in the form of two combs (here "E"-shaped).

It is thus possible for a plate P2 of an opposing second package PAK2 to protrude between two respective plates P1 of a first package PAK1.

Furthermore, a supporting of the packages in an adjustable manner with an adjusting screw STS allows the individual comb-shaped or "E"-shaped packages to be linearly shifted into one another by the adjustment screw STS. With the adjusting screw STS it is possible to either drive the comb-shaped or "E"-shaped packages PAK1, PAK2 apart from one another (in order to set a minimal overlap of the plate packages PAK1, PAK2) or to drive the plates P1, P2 of the packages PAK1, PAK2 over one another (so that a maximum overlap of the plate packages PAK1, PAK2 is set).

Figure 3E:
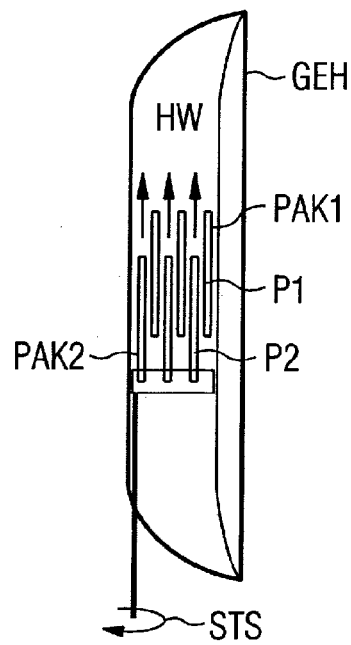
Figure 3F:
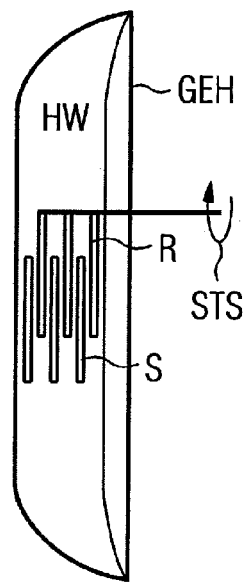

In a sixth embodiment according to FIG. 3F the "E-shaped" plate packages are shifted into one another not linearly but rather radially, comparable to the principle of a plate capacitor with variable, adjustable capacity. The plates (produced from the dielectric material) of a rotor R then perform a rotation movement and are shifted between the plates (produced from the dielectric material) of a stator S.

In the fifth embodiment according to FIG. 3E and the sixth embodiment according to FIG. 3F, overlap regions of the individual plates or, respectively, plate packages are varied; the total effect or, respectively, the resulting dielectric conductivity of the design is adapted to the requirements of the application and specifically adjusted.

The embodiments of FIG. 3 illustrated here are only exemplary and are without limitation to the principle of the invention.

FIG. 4A through FIG. 4E show variations of the dielectric conductivity of the material relative to a resulting dielectric conductivity and of the volume of the material relative to a resulting volume.

In FIG. 4A a single plate 1 made from insulating dielectric material is placed on a measurement subject MO, the plate 1 exhibiting a dielectric conductivity of $\in=2000$.

In FIG. 4B two plates 2 made from insulating dielectric material are placed on the measurement subject MO, whereby the two plates 2 respectively exhibit a dielectric conductivity of $\in=2000$.

Here the resulting volume is enlarged relative to FIG. 4A given a constant plate size.

In an another embodiment, the resulting dielectric conductivity can also be influenced by a pre-established air gap between the two plates 2.

In FIG. 4C in total five plates 5 made from insulating dielectric material are placed on the measurement subject MO. First and second plates 5 respectively exhibit a dielectric conductivity of $\in=2000$. Third and fourth plates 5 each exhibit a dielectric conductivity of $\in=1300$. A fifth plate 5 exhibits a dielectric conductivity of $\in=1700$.

The five plates are vertically stacked atop one another so that, in addition to the volume, the resulting dielectric conductivity was also altered in relation to FIG. 4A.

In an advantageous development the resulting dielectric conductivity can also additionally be influenced by pre-established air gaps or separations between the plates 5.

In FIG. 4D in total five plates 1, 2, 3 made from insulating dielectric material are placed on the measurement subject MO.

First and second plates 1 respectively exhibit a dielectric conductivity of $\in=2000$. Third and fourth plates 2 exhibit a dielectric conductivity of $\in=1300$. The first through fourth plates 1, 2 are arranged in a plane.

A fifth plate 3 exhibits a dielectric conductivity of $\in=1700$ and is placed atop this plane.

In addition to the volume, the resulting dielectric conductivity is also altered in relation to FIG. 4A via the arrangement of the five plates.

In an embodiment, the resulting dielectric conductivity can also be influenced by pre-established air gaps or separations between the individual plates.

In FIG. 4E in total two plates 1 made from insulating dielectric material are placed on the measurement subject MO. First and a second plates 1 respectively exhibit a dielectric conductivity of $\in=2000$.

The volume is changed in relation to FIG. 4A via the arrangement of the two plates.

In an embodiment, the resulting dielectric conductivity can also be influenced by a pre-established air gap or separation between the plates 1.

Figure 7:
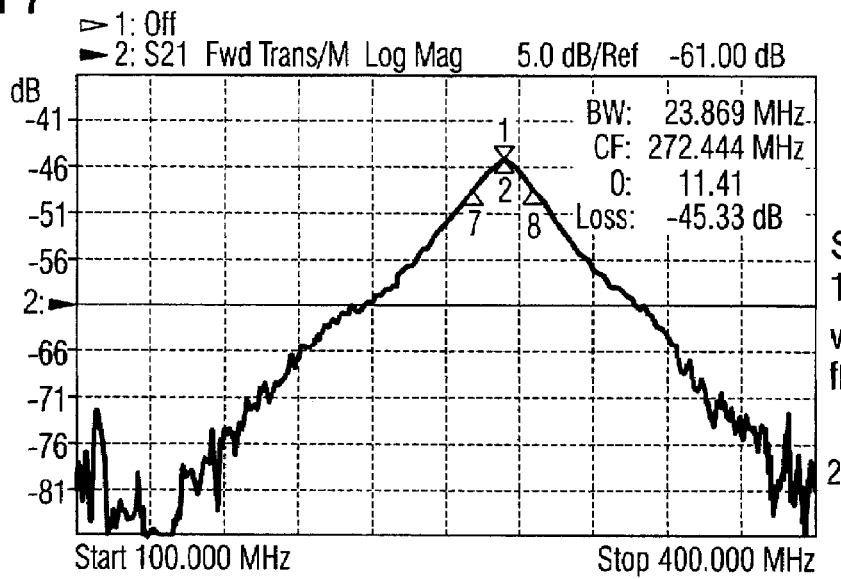

FIG. 5 through 7 show dielectric resonances of individual plates.

Figure 8:
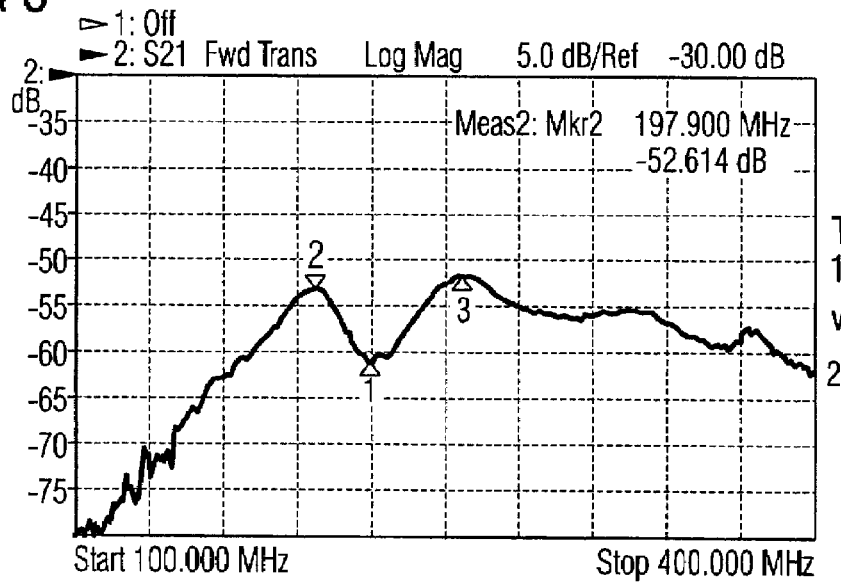
FIG. 8 and FIG. 9 are graphs respectively showing dielectric resonances of stacked plates with an air gap for weak coupling.
Figure 9:
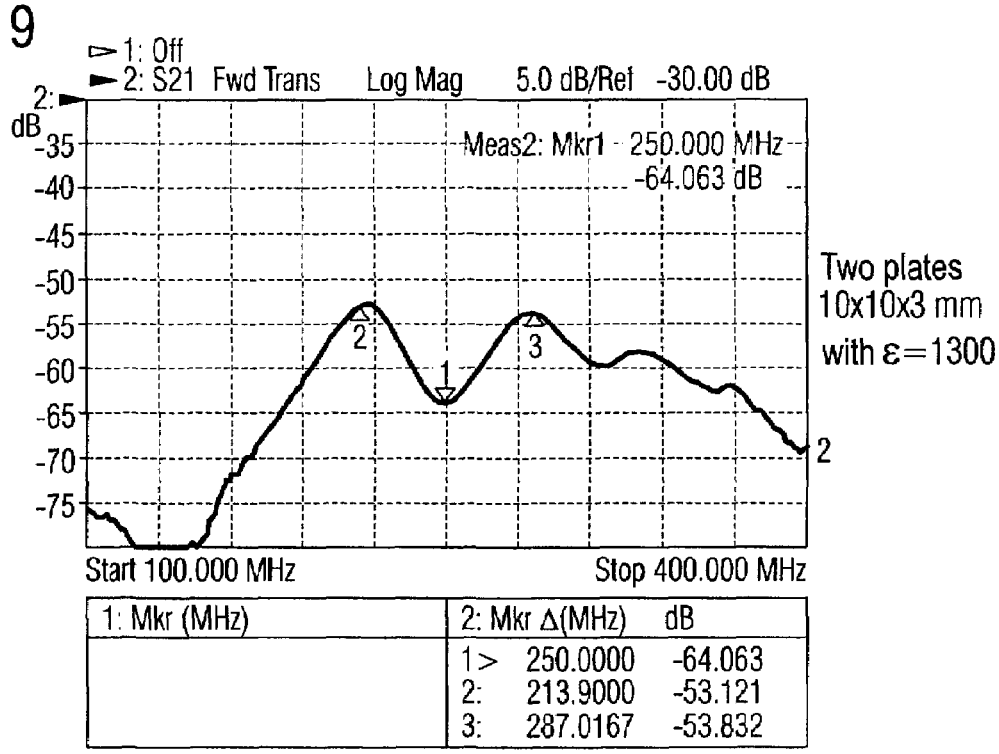

FIG. 8 and FIG. 9 show dielectric resonances of stacked plates with an air gap for weak coupling.

Figure 10:
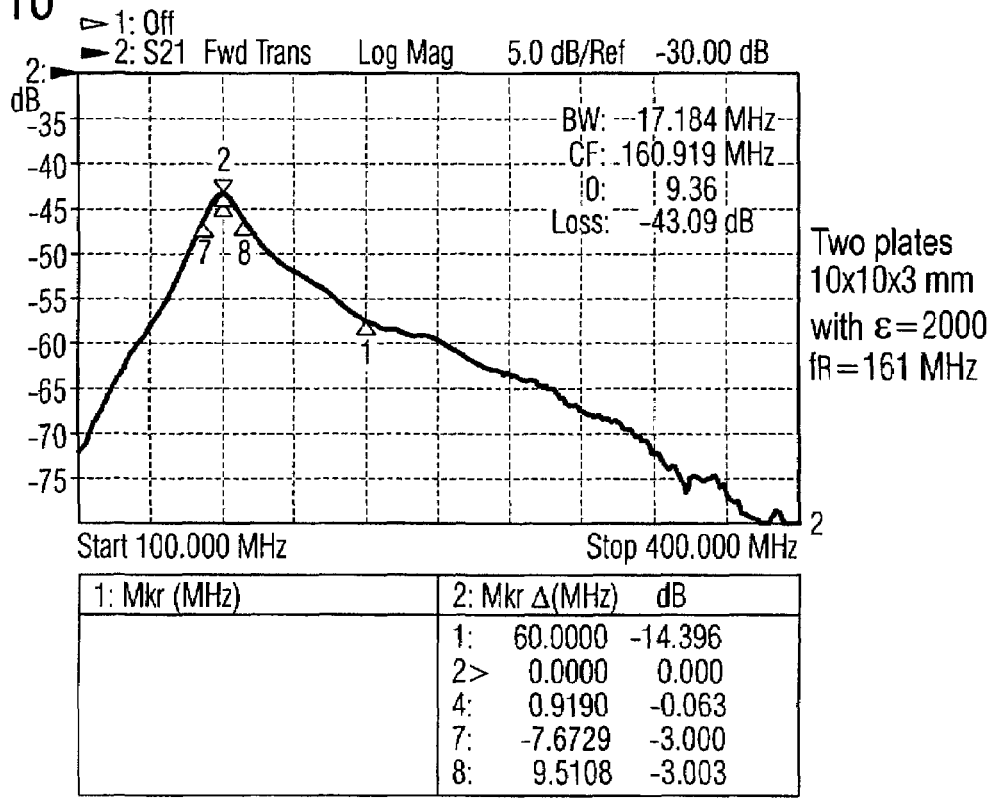

FIG. 10 through FIG. 12 show dielectric resonances of stacked plates without air gap, thus with strong coupling.

With regard to FIGS. 5 through 12 it is established that respective resonance frequencies can be adjusted by the described variations of the compensation material. These exhibit a greater or smaller deviation from a resonance frequency that is used for MR examination. The focusing described above can be set by this deviation.

Although modifications and changes may be suggested by those skilled in the art, it is the intention of the inventors to embody within the patent warranted hereon all changes and modifications as reasonably and properly come within the scope of their contribution to the art.

We claim as our invention:

1. An arrangement for radiating a radio-frequency field into an examination subject in a magnetic resonance apparatus, comprising:
   a local coil having a housing configured to physically interact with an examination subject in a magnetic resonance apparatus to radiate a B1 field into the examination subject;
   said housing having a housing portion comprising insulating dielectric material that passively compensates an inhomogeneity in said B1 field in the examination subject; and
   an adjustment arrangement that allows fixed but detachable provision of said insulating dielectric material at said housing portion to adjust the compensation of the inhomogeneity by said insulating dielectric material.

2. An arrangement as claimed in claim 1 wherein said adjustment arrangement allows adjustment of said compensation by selective placement of position of the insulating dielectric material at the housing.

3. An arrangement as claimed in claim 2 wherein said adjustment arrangement allows variation of at least one characteristic of said insulating dielectric material selected from the group consisting of volume and dielectric conductivity.

4. An arrangement as claimed in claim 1 wherein said housing has a first side configured to face the examination subject and a second side configured to face away from the examination subject, and wherein said housing portion comprising said insulating dielectric material is at said first side.

5. An arrangement as claimed in claim 1 wherein said insulating dielectric material comprises a plurality of material components having prefabricated shapes, and wherein said adjustment arrangement comprises a plurality of recesses in said housing portion conforming to said prefabricated shapes that respectively receive said material components therein.

6. An arrangement as claimed in claim 5 wherein said recesses are arranged in a checkerboard pattern at said housing portion.

7. An arrangement as claimed in claim 5 wherein said adjustment arrangement comprises a locking mechanism that locks said material components in the recesses.

8. An arrangement as claimed in claim 5 comprising a protective casing that covers said housing portion with said material components in said recesses.

9. An arrangement as claimed in claim 1 wherein said housing is comprised of at least first and second housing parts that are openable relative to each other to allow access to an interior of said housing, and wherein said adjustment arrangement is disposed in said interior of said housing.

10. An arrangement as claimed in claim 1 wherein said housing comprises a hollow wall, and wherein said adjustment arrangement is disposed inside said hollow wall.

11. An arrangement as claimed in claim 1 wherein said insulating dielectric material is comprised of a plurality of plate-shaped material components, and wherein said adjustment arrangement holds a selected number of said plate-like components in a stack.

12. An arrangement as claimed in claim 11 wherein said adjustment arrangement holds said plate-shaped components in said stack separated by elastic foamed material respectively between adjacent plate-like components in said stack.

13. An arrangement as claimed in claim 12 wherein said adjustment arrangement comprises an adjusting screw coupled with said plate-like components and said foamed material to allow adjustment of separation between adjacent plate-like components by rotation of said adjustment screw.

14. An arrangement as claimed in claim 1 wherein said insulating dielectric material is comprised of a plurality of plate-shaped components respectively held by said adjustment arrangement in a first comb structure in a first stack and in a second comb structure in a second stack, with the plate-like components in said first and second comb structures being interleaved with each other, and wherein said adjustment arrangement sets a degree of coupling between the plate-like components in the first comb structure and the plate-like components in the second comb structure by controlling an amount of overlap between said first and second comb structures.

* * * * *